United States Patent
Deng et al.

(10) Patent No.: US 9,379,153 B2
(45) Date of Patent: Jun. 28, 2016

(54) METHOD FOR FORMING IMAGE SENSING DEVICE

(75) Inventors: Jau-Jan Deng, Taipei (TW); Wei-Ping Chen, Taipei County (TW); Jui-Yi Chiu, Yilan County (TW)

(73) Assignees: VisEra TECHNOLOGIES COMPANY LIMITED, Hsinchu (TW); OMNIVISION TECHNOLOGIES, INC., Santa Clara, CA (US)

( * ) Notice: Subject to any disclaimer, the term of this patent is extended or adjusted under 35 U.S.C. 154(b) by 1567 days.

(21) Appl. No.: 12/765,460

(22) Filed: Apr. 22, 2010

(65) Prior Publication Data

US 2011/0260345 A1   Oct. 27, 2011

(51) Int. Cl.
*B29C 43/02* (2006.01)
*H01L 27/146* (2006.01)

(52) U.S. Cl.
CPC .... *H01L 27/14618* (2013.01); *H01L 27/14683* (2013.01); *H01L 2924/0002* (2013.01)

(58) Field of Classification Search
USPC ................. 264/1.1, 1.7, 2.5; 425/808
IPC ............... H01L 27/14618, 27/14683, 2924/0002
See application file for complete search history.

(56) References Cited

U.S. PATENT DOCUMENTS 6,710,945 B1 *   3/2004   Miranda .................... 359/819

FOREIGN PATENT DOCUMENTS

| CN | 1543577 | 11/2004 |
|----|---------|---------|
| CN | 1760148 | 4/2006 |
| CN | 101085543 | 12/2007 |
| CN | 101442062 | 5/2009 |
| TW | 200640808 | 12/2006 |

* cited by examiner

*Primary Examiner* — Mathieu Vargot
(74) *Attorney, Agent, or Firm* — Muncy, Geissler, Olds & Lowe, P.C.

(57) ABSTRACT

A method for forming an image sensing device is disclosed, including providing a molding apparatus, disposing a lens in the molding apparatus, injecting an injection material into a chamber of the molding apparatus to form a shell which is connected to the lens, opening the chamber of the molding apparatus to remove the lens and the shell connected to the lens, and assembling the shell with an image sensing element.

7 Claims, 14 Drawing Sheets

METHOD FOR FORMING IMAGE SENSING DEVICE

BACKGROUND OF THE INVENTION

1. Field of the Invention

The invention relates to image sensor technology and more particularly to a method for forming an image sensing device.

2. Description of the Related Art

An image sensor converts optical information into electrical signals. Charge coupled devices (CCD) and complementary metal oxide semiconductor CMOS image sensor devices are widely used in digital imaging applications. Recently, with continued advanced technological development, there has also been an increasing demand for highly-efficient image sensors in various fields such as digital cameras, camcorders, personal communication systems, game devices, surveillance cameras, micro-cameras for medical use, robots, and so on. FIG. 1 shows a cross section to illustrate fabrication of a conventional lens package. In FIG. 1, a conventional lens 102 and a barrel 104 are assembled and the assembled device is then combined with a sensor holder 106 and an image sensing element 108. The conventional lens package is manually assembled. Thus, the cost is high and yield is low. FIG. 2 shows a cross section to illustrate fabrication of a conventional wafer level lens package. In FIG. 2, a glass spacer 206 is interposed between a wafer level lens 202 and an image sensing element 204. Focusing of the wafer level lens package device is performed according to thickness of the glass spacer 206. In order to fit various product specifications, a plurality of glass spacers 206 are required. However, the glass spacers are expensive and thus cost of the wafer level lens package is high.

BRIEF SUMMARY OF INVENTION

Accordingly, the invention provides a method for forming an image sensing device, comprising providing a molding apparatus, disposing a lens in the molding apparatus, injecting an injection material into a chamber of the molding apparatus to form a shell which is connected to the lens, opening the chamber of the molding apparatus to remove the lens and the shell connected to the lens, and assembling the shell with an image sensing element. In an embodiment of the invention, the lens is a wafer level lens comprising at least a substrate with at least a surface thereon. The injection material can comprise polycarbonate (PC), acrylonitrile butadiene styrene (ABS), liquid crystal polymer resin (LCP) or polyvinylchloride (PVC).

A molding apparatus, comprising a bottom mold, a top mold over the bottom mold; a base part between the top mold and the bottom mold, and a plurality of micro positioning elements on the bottom mold and the top mold is provided. In an embodiment of the invention, the micro positioning elements are micro protrusions or micro recesses, and the micro positioning elements have sizes of between 0.1 mm~5 cm.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
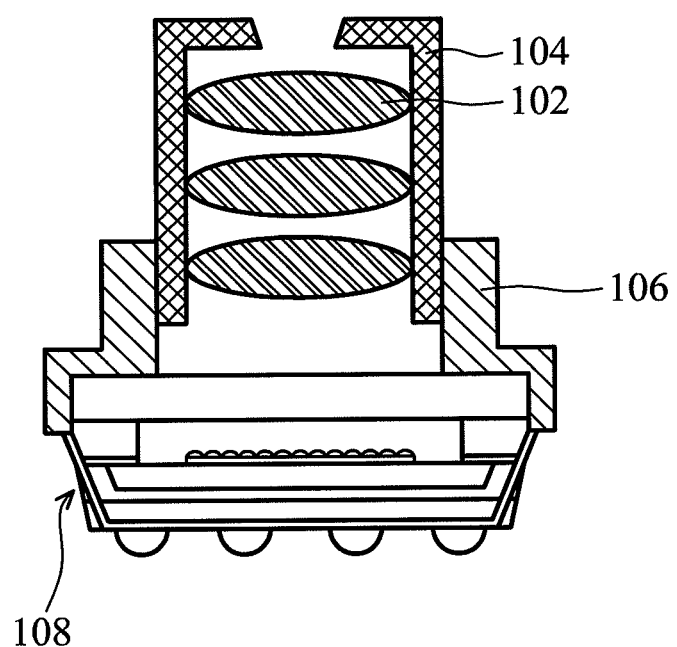
FIG. 1 shows a cross section to illustrate fabrication of a conventional lens package.
Figure 2:
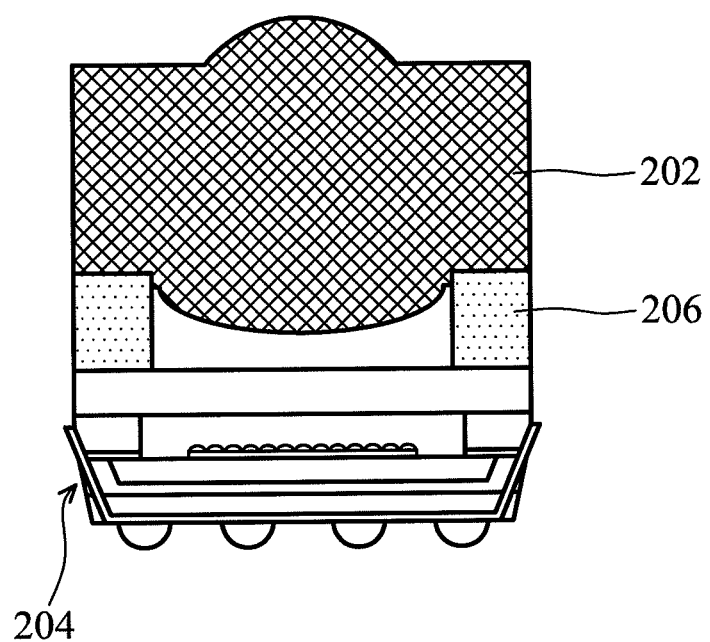
FIG. 2 shows a cross section to illustrate fabrication of a conventional wafer level lens package.
Figure 3A:
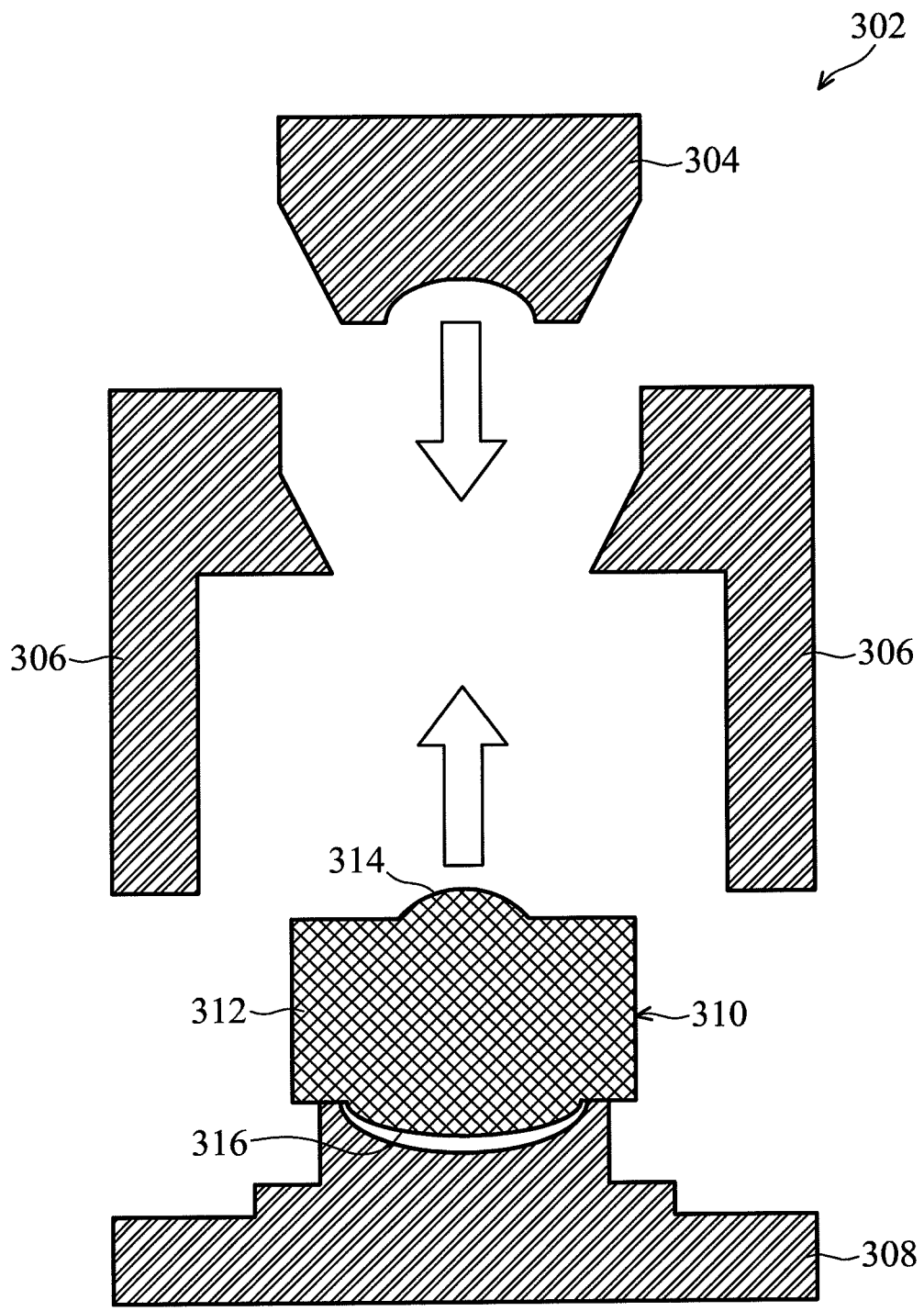
FIGS. 3A through 3F are cross sections illustrating a method for fabricating an image sensing package according to an embodiment of the invention.

FIGS. 3A through 3F are cross sections illustrating a method for fabricating an image sensing package according to an embodiment of the invention. Referring to FIG. 3A, a molding apparatus 302 is provided. In an embodiment, the molding apparatus 302 has three parts, for example a top mold 304, a bottom mold 308 and a base part 306, as shown in FIG. 3A. Specifically, the molding apparatus 302 can be formed by the steps of providing bottom mold 308, forming a top mold 304 over the bottom mold 308, and forming a base part 306 between the top mold 304 and the bottom mold 308. In an alternative embodiment, the molding apparatus can have four parts. Next, a lens 310 is initially fixed in the molding apparatus 302. The lens 310 in the embodiment is a wafer-level lens formed by wafer-level optics technology. The wafer level lens 310 may include a substrate 312 with a first surface 314 and a second surface 316 on the opposite sites. Note that the invention is not limited to the lens shown in the FIG. 3A. Any other kind of wafer-level lens can be used in the application. For example, the lens can be a single-sided lens or a double-sided lens. Also, the two sides of the lens can be convex shaped or concaved shaped, or one side of the lens can be convex shaped and the other side of the lens can be concave shaped.

Figure 3B:
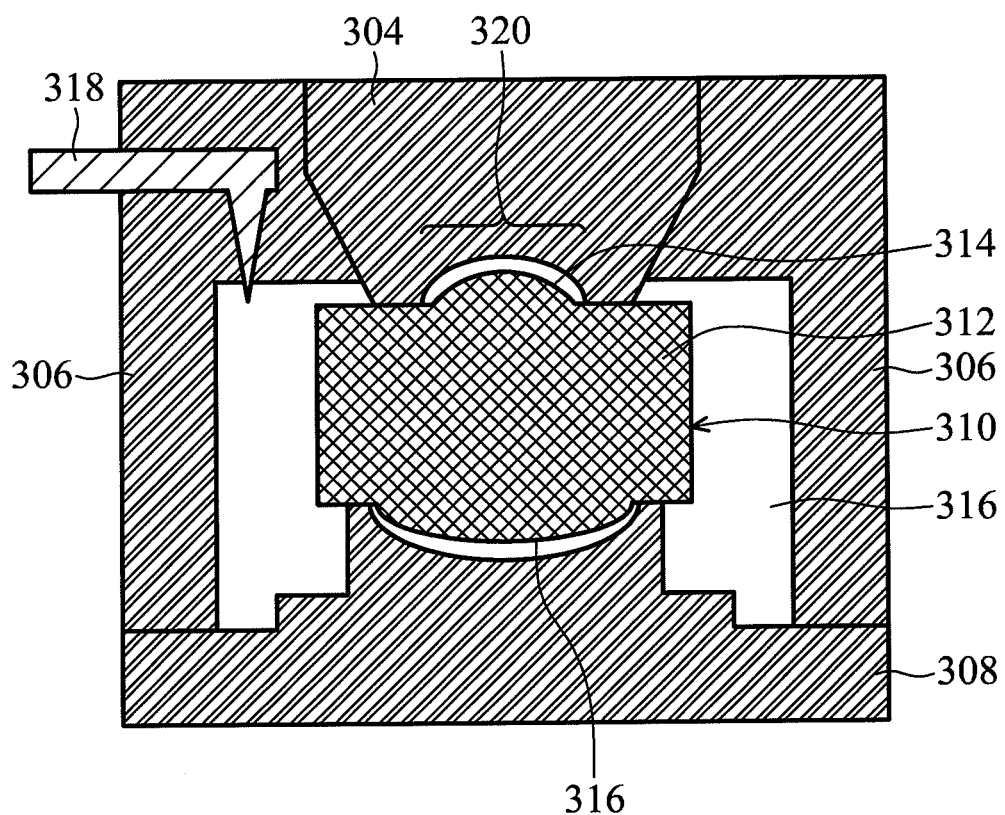
Figure 3C:
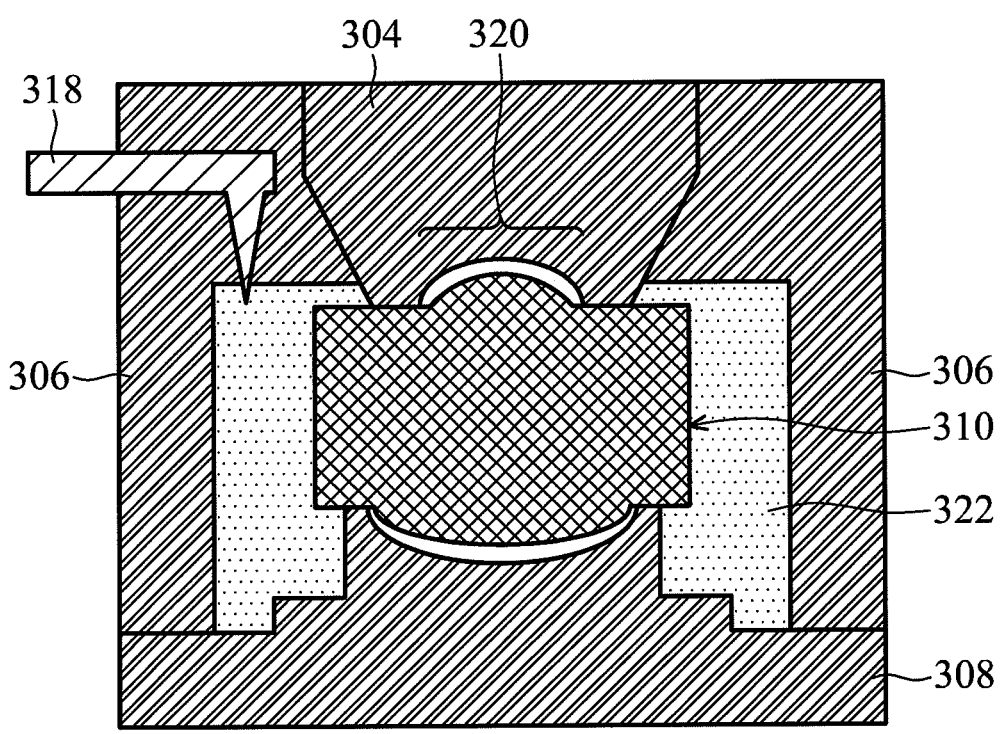

Referring to FIG. 3B, the parts 304, 306, 308 of the molding apparatus 302 are enclosed and the lens 310 is completely fixed in the molding apparatus 302. In an embodiment, a chamber 316 is formed in the molding apparatus 302. An injection channel 318 for insert molding is disposed in the molding apparatus 302. Note that the optical effective area 320 cannot be exposed so that the injection materials in following steps are prevented from covering the optical effective areas. As well, the top surface 314 and bottom surface 316 of the lens 310 can be covered by the top mold 304 and the bottom mold 308 of the molding apparatus 302, respectively. Referring to FIG. 3C, an insert molding step is performed to inject an injection material into the chamber to form a shell 322 which is connected to the lens 310. The injection material can be high temperature endurance material, such as polycarbonate (PC), acrylonitrile butadiene styrene (ABS), polyvinylchloride (PVC), liquid crystal polymer resin (LCP) or other suitable materials. Alternatively, the injection material can also be electromagnetic interference (EMI) resistant material. In an embodiment, the injection material can be high temperature endurance material, such as polycarbonate (PC), acrylonitrile butadiene styrene (ABS), polyvinylchloride (PVC) or other suitable materials, doped with metal particles. The metal preferably has high heat conduction. For example, the metal can be copper or other suitable materials. In an alternative embodiment, a metal layer (not shown) can be formed to cover the lens for electromagnetic interference (EMI) protection before performing the insert molding step. If a metal layer is formed on the lens, doping metal particles into the injection material can be omitted, and thus the invention can use high temperature endurance material which has lower cost than EMI resistant material to save costs.

The direction and opening of the injection channel 318 can be designed by fluid analysis to ensure that the lens 310 is not damaged during the insert molding process. In an example, the opening of the injection channel 318 is not directly toward the lens 310 such that the injection material may not damage the lens. In an example, the chamber 316 can be specifically designed for the shell 322 to have a recess to be assembled with an image sensing element.

Figure 3D:
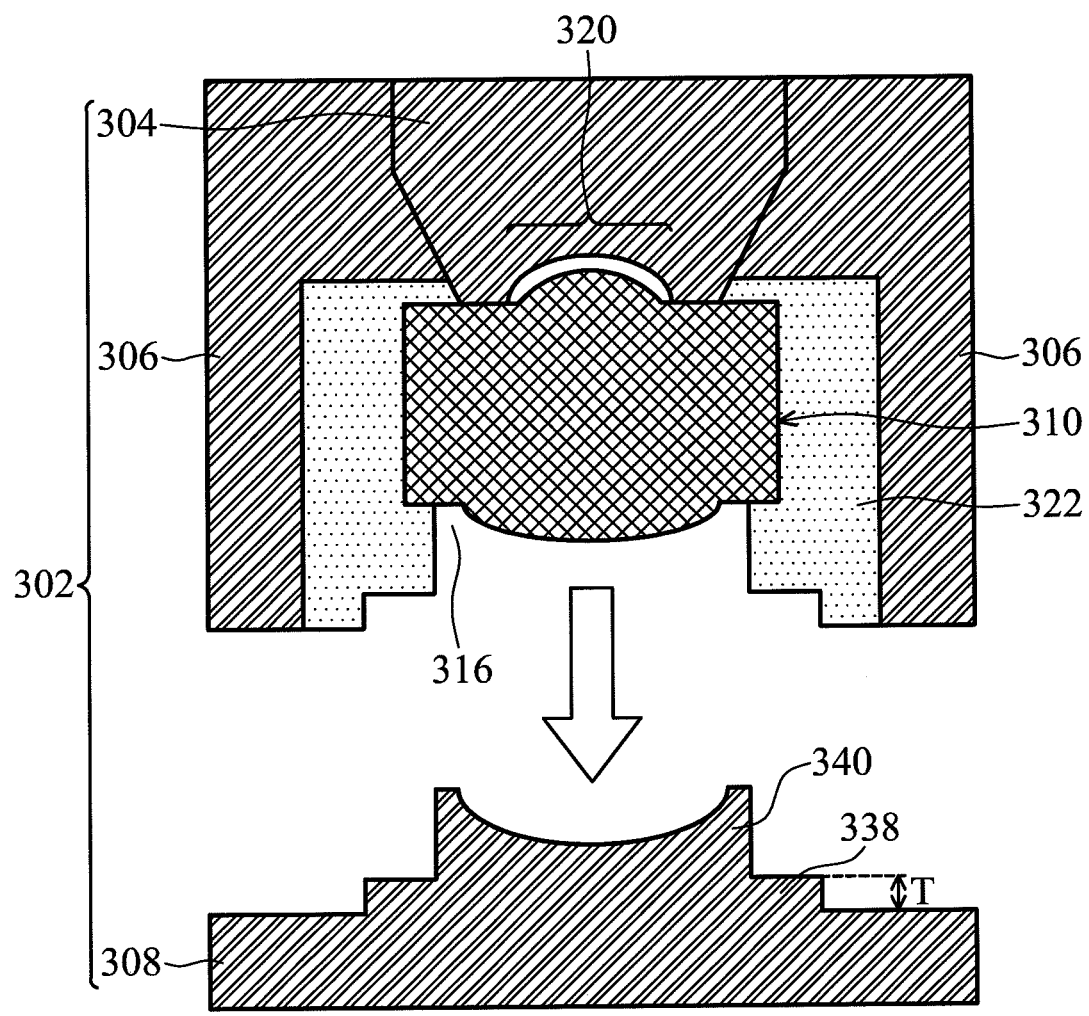
Figure 3E:
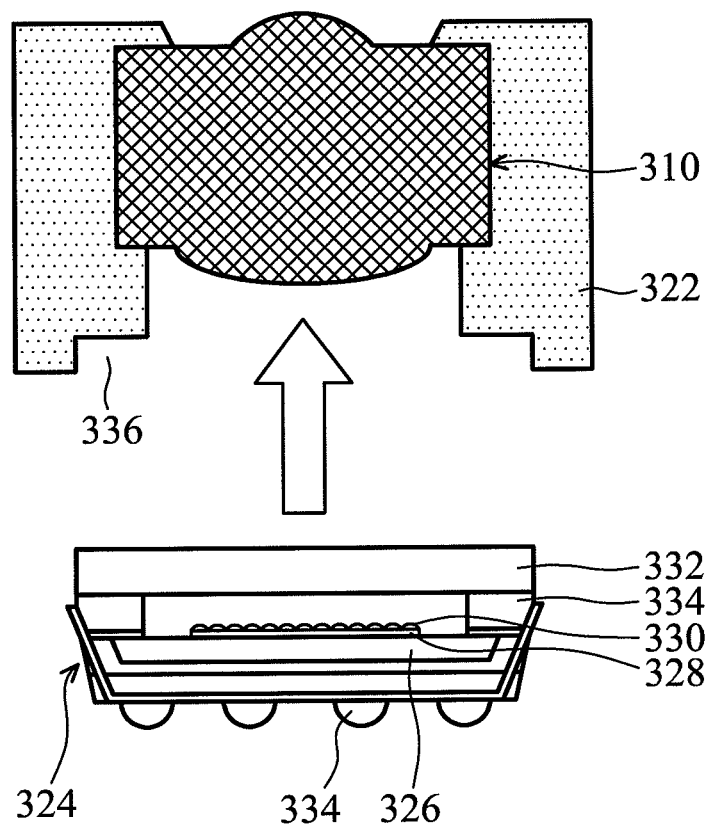
Figure 3F:
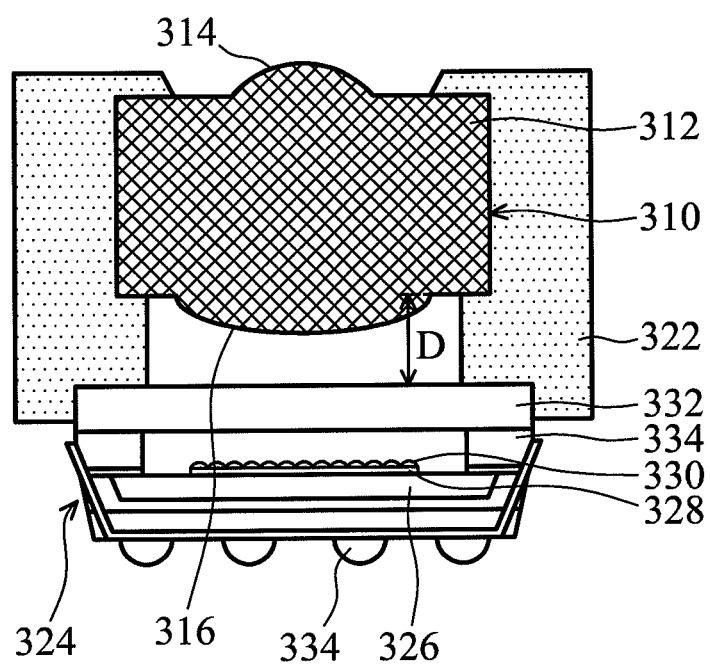

Referring to FIG. 3D, after cooling, the chamber 316 of the molding apparatus 302 is opened to remove the lens 310 with the shell 322. Referring to FIG. 3E, the lens 310 is assembled with an image sensing element 324. In an embodiment, the image sensing element 324 can be formed by the steps comprising providing a substrate 326, forming a photoelectric element array 328 on the substrate 326, forming a micro lens array 330 on the photoelectric element array 328, forming a covering substrate 332 over the substrate 326, forming a spacer 334 for supporting the covering substrate 332 and forming a plurality of solder balls 334 under the substrate 326. Preferably, the covering substrate 332 of the image sensing element 324 is fit into the recess 336 of the shell 322 during assembly of the lens 310 and the image sensing element 324, as shown in FIG. 3F. Note that the invention can adjust the distance D from the surface of the recess 336 to the bottom surface of the substrate of the lens 310 to correspond with a back focal length (BFL) of the lens 310. Referring back to FIG. 3D, the invention can specifically design the bottom mold 308 of the molding apparatus 302 for the shell 322 to have a suitable distance from the surface of the recess 336 to the bottom surface of the substrate of the lens 310. In more detail, the bottom mold 308 of the molding apparatus 302 can comprise a first protruding portion 338 and a second protruding portion 340 on the first protruding portion 338 and the invention can specifically design thickness T of the first protruding portion 338 of the bottom mold 308 of the molding apparatus 302 for the shell 322 to have a suitable distance from the surface of the recess 336 to the bottom surface of the substrate of the lens 310 for fitting the back focal length of the lens 310. Therefore, the lens can be directly combined with the shell and connected to the lens and spacers are not required. The invention can further design a bottom mold 308 with various sizes for the photo image sensing device package of the invention to accommodate various product specifications. Further, the shell can protect the lens from damage and hinder particles from being dropped on the sides of the lens. Moreover, the embodiment using insert molding to form a shell connected to the lens has advantages of employing SMT automated packaging technology, wherein parts are efficiently managed.

Figure 4A:
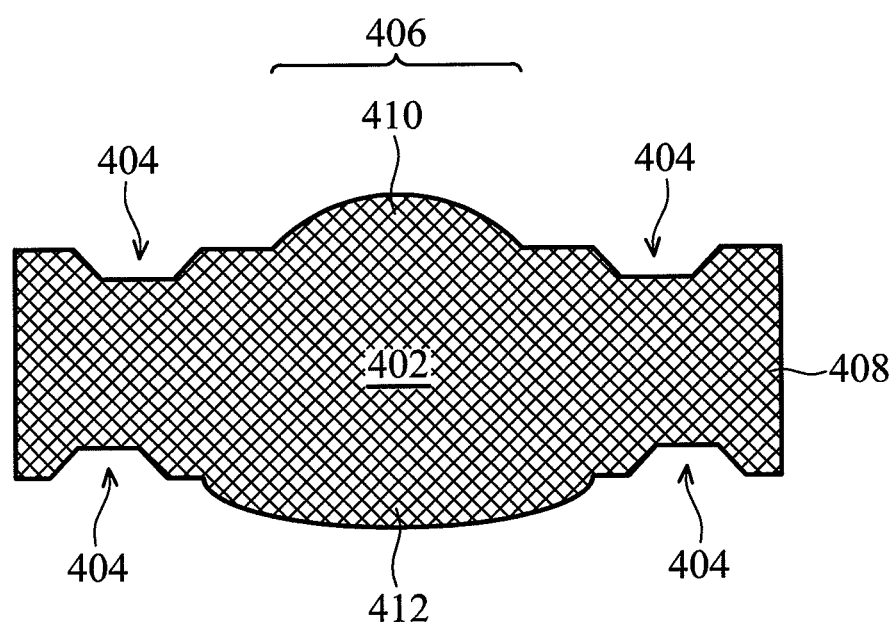
FIGS. 4A through 4C are cross sections illustrating a method for positioning between a lens and a molding apparatus according to an embodiment of the invention.
Figure 4B:
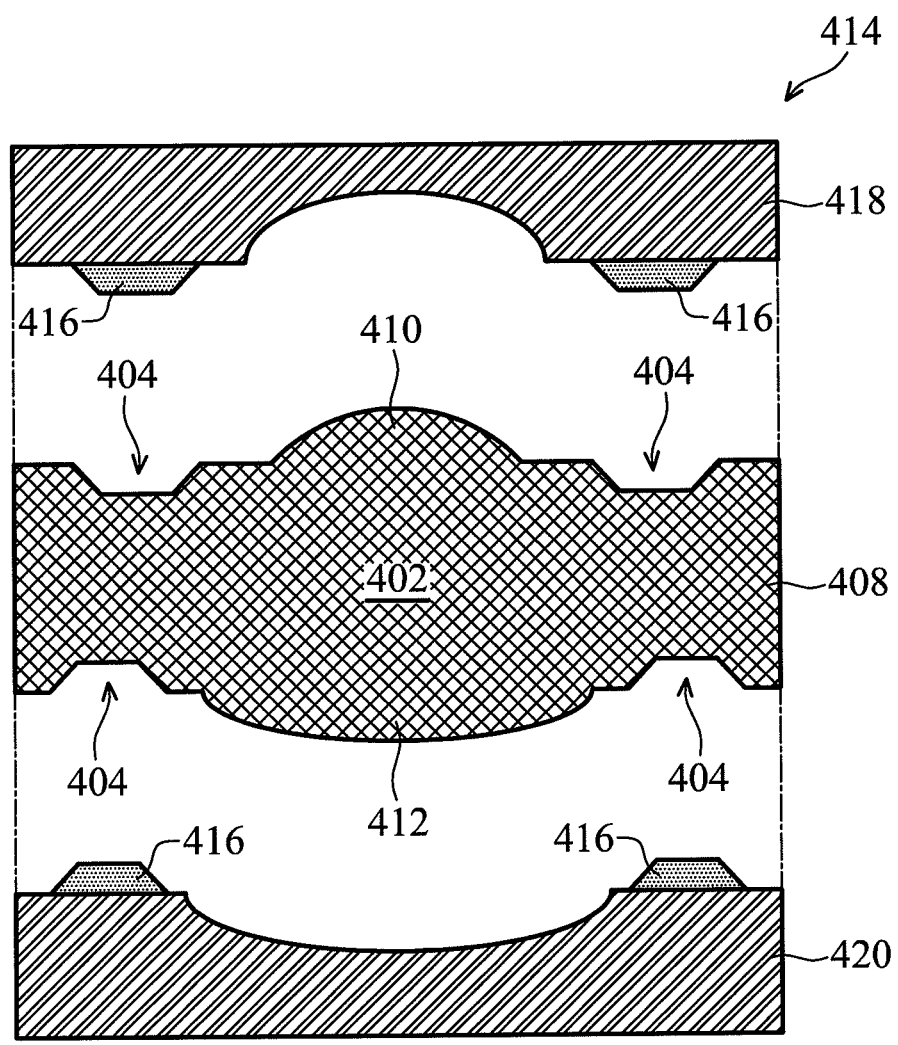
Figure 4C:
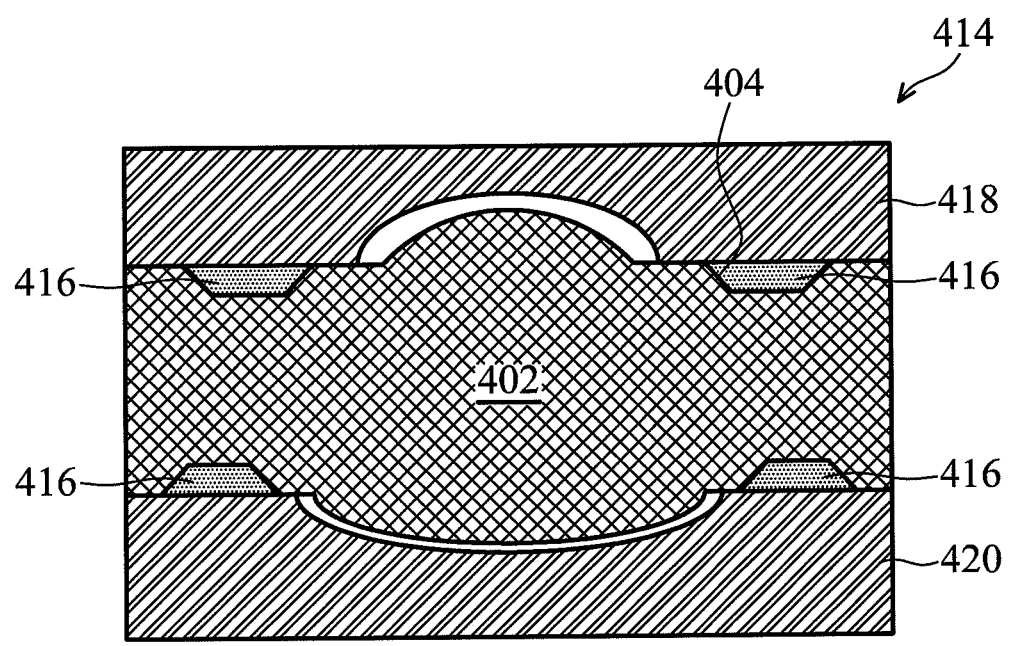

FIGS. 4A through 4C are cross sections illustrating a method for positioning between a lens and a molding apparatus according to an embodiment of the invention. Referring to FIG. 4A, a lens 402 comprising a plurality of micro positioning elements 404 is provided. The micro positioning elements 404 can be micro recesses or protrusions. The invention does limit the shape of the micro positioning elements 404. In an embodiment, the micro positioning elements 404 can be wedge-shaped or rounded shaped recess. Alternatively, the micro positioning elements 404 can be wedge-shaped or rounded shaped protrusions. There are at least three or four micro positioning elements 404 on each side of the lens. Note that the micro positioning elements 404 of the lens 402 cannot be within the optical effective area 406 of the lens. In an embodiment, the lens 402 is a wafer level lens comprising a substrate 408 with surfaces 410, 412 on opposite sides of the substrate 408. The micro positioning elements 404 are on the first side and the second side of the substrate 408 of the wafer level lens beyond the convex or concave portions 410, 412.

Referring to FIG. 4B, a molding apparatus 414 comprising a plurality of micro positioning elements 416 is provided. The micro positioning elements 416 of the molding apparatus 414 can be micro recesses or protrusions. The invention also does not limit the shape of the micro positioning elements 416 of the molding apparatus 414. In an embodiment, the micro positioning elements 416 of the molding apparatus 414 can be wedge-shaped or rounded shaped recess. Alternatively, the micro positioning elements 416 of the molding apparatus 414 can be wedge-shaped or rounded shaped protrusions. As shown in FIG. 4B, the micro positioning elements 416 are disposed on a top mold 418 and a bottom mold 420 of the molding apparatus 414 and there are at least three or four micro positioning elements 416 on the top mold 418 and bottom mold 420 of the molding apparatus 414. Note that the features of the micro positioning elements 416 of the molding apparatus 414 must correspond with the features of the micro positioning elements 404 of the lens 402, as shown in FIG. 4C. For example, when the micro positioning elements 404 of the lens 402 is a wedge-shaped recess, the micro positioning elements 416 of the molding apparatus 414 can be wedge-shaped protrusions. Alternatively, when the micro positioning elements 404 of the lens 402 are wedge-shaped protrusions, the micro positioning elements 416 of the molding apparatus 414 can be wedge-shaped recesses. Further, when the micro positioning elements 404 of the lens 402 are round-shaped protrusions, the micro positioning elements 416 of the molding apparatus 414 can be round-shaped recesses. When the micro positioning elements 404 of the lens 406 are round-shaped recesses, the micro positioning elements 416 of the molding apparatus 414 can be round-shaped protrusions. In an embodiment of the invention, both the micro positioning elements 404, 416 on the lens 402 and the molding apparatus 414 have sizes of between 0.01 mm-10 cm. With the micro positioning elements 404, 416 on the lens 402 and the molding apparatus 414, the lens 402 and the molding apparatus 414 can be precisely positioned to increase fabricating yield of the shell of the optical device package during insert molding.

Figure 5A:
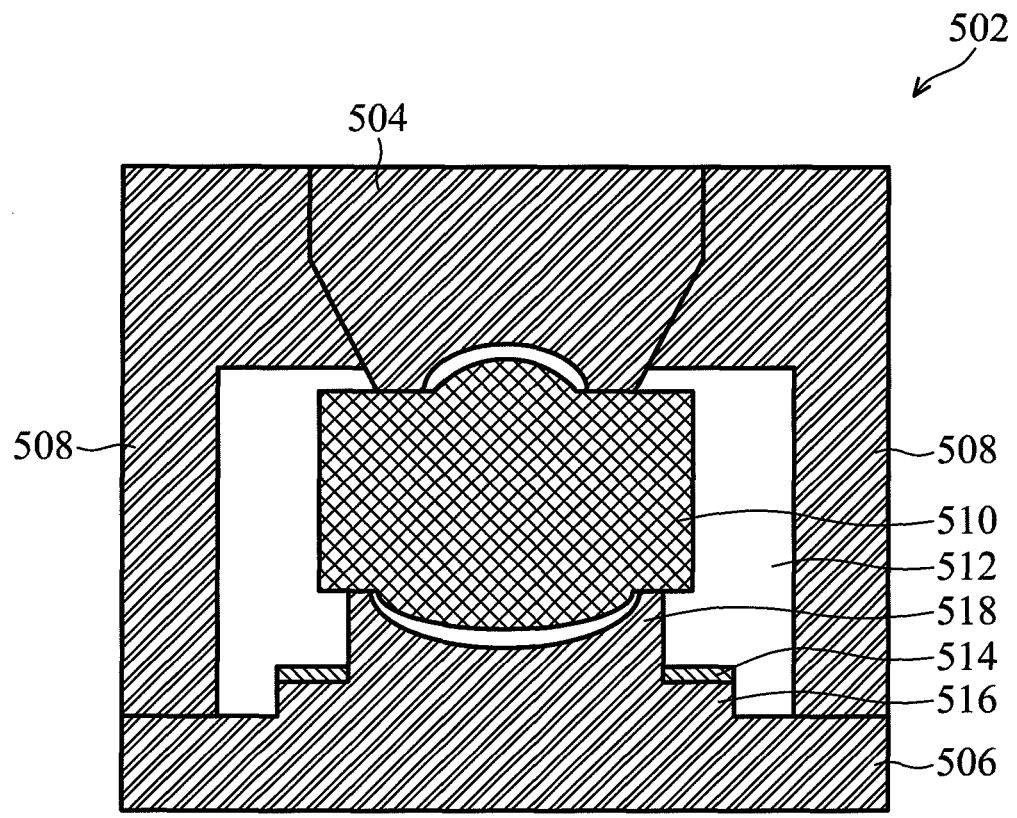
FIGS. 5A~5B show cross sections illustrating a method for adjusting a distance between a surface of a recess of a shell and a bottom surface of a lens substrate during an insert molding process of an embodiment of the invention.
Figure 5B:
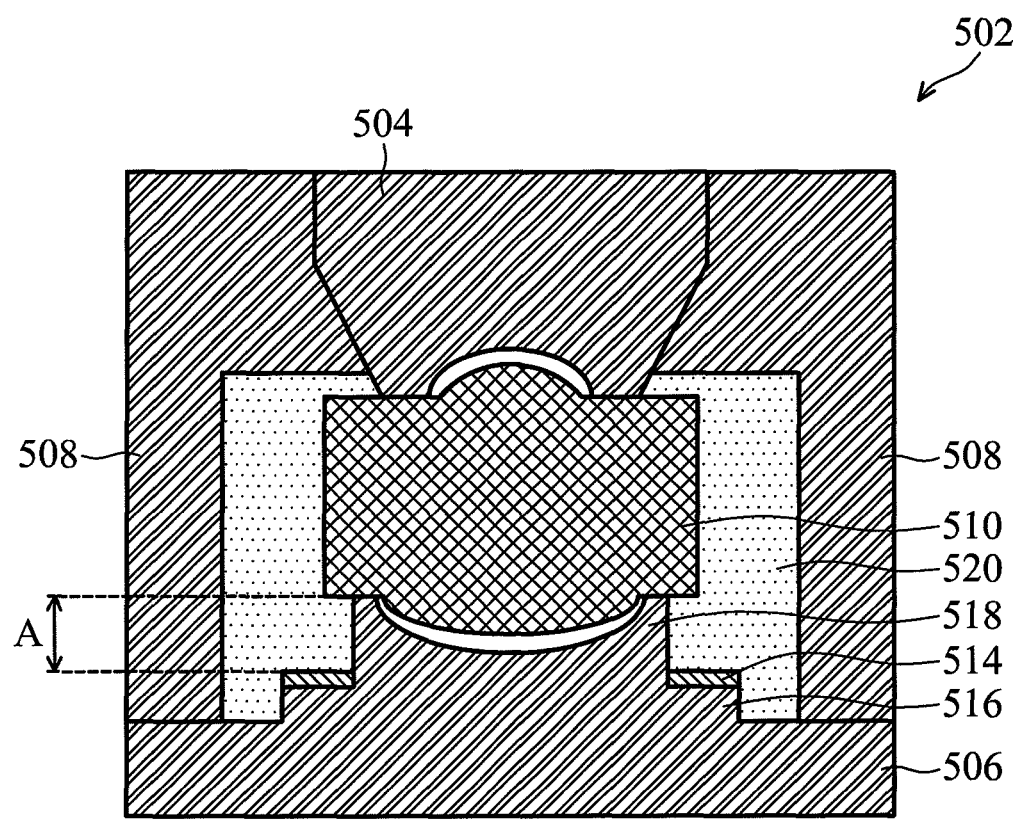

FIG. 5A shows a cross section illustrating a method for adjusting depth of a recess of the shell during an insert molding process of an embodiment of the invention. In FIG. 5A, a molding apparatus 502 comprising a top mold 504, a bottom mold 506 and a base part 508 therebetween is provided and a lens 510 is fixed in the molding apparatus 502. Before performing an insert molding step to inject an injection material into the chamber 512 to form a shell which is connected to the lens, a height adjusting element 514 may be employed on the bottom mold 516. In more detail, the bottom mold 506 comprises a first protruding portion 516 and a second protruding portion 518 on the first protruding portion 516. Specifically, the first protruding portion 516 is column-shaped, and the second protruding portion 518 is column-shaped with less diameter than the first protruding portion, wherein the second protruding portion 518 has a recess. The height adjusting element 514 can be a ring on the first protruding portion 516 surrounding the second protruding portion 518 of the bottom mold 506. Referring to FIG. 5B, an insert molding step is performed to inject an injection material into the chamber to form a shell 520 which is connected to the lens 510. In FIG. 5B, the distance A between a surface of the recess of the shell and the bottom surface of the substrate of the lens 510 can be decreased by the height adjusting element 514. Therefore, the embodiment can adjust thickness of the height adjusting element 514 to correspond with the back focal length (BFL) of the lens device package.

Figure 6:
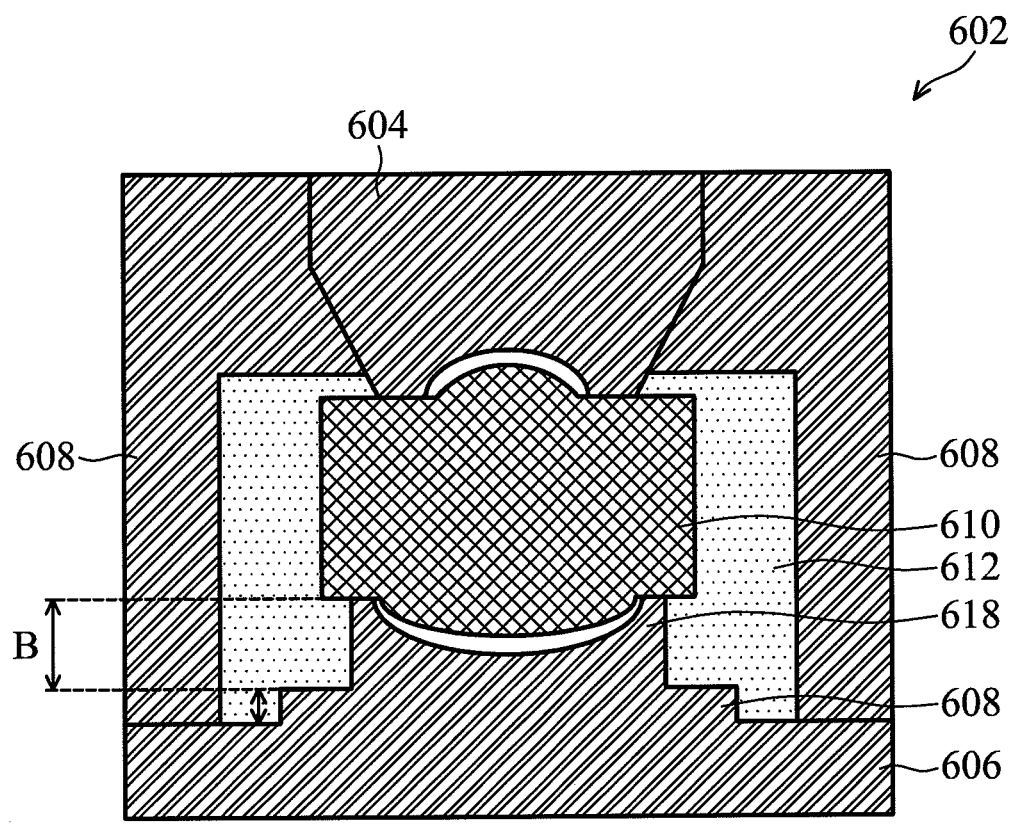
FIG. 6 shows a cross section illustrating a method for adjusting a distance between a surface of a recess of a shell and a bottom surface of a lens substrate during an insert molding process of another embodiment of the invention.

FIG. 6 shows a cross section illustrating a method for adjusting depth of a recess of the shell during an insert molding process of another embodiment of the invention. In FIG. 6A, a molding apparatus comprising a top mold 604, a bottom mold 606 and a base part 608 therebetween is provided and a lens 610 is fixed in the molding apparatus 602. The bottom mold 606 comprises a first protruding portion 608 and a second protruding portion 618 on the first protruding portion 608. In the embodiment, the first protruding portion 608 of the molding apparatus 602 can move upward or downward. The distance B between a surface of the recess of the shell 612 and the bottom surface of the substrate of the lens 610 can be decreased when the first protruding portion 608 of the molding apparatus 602 is moved upward. The distance B between a surface of the recess of the shell 612 and the bottom surface of the substrate of the lens 610 can be increased when the first protruding portion 608 of the molding apparatus 602 is moved downward. Therefore, distance B between a surface of the recess of the shell 612 and the bottom surface of the substrate of the lens 610 can be controlled by adjusting the height of the first protruding portion 608 of the molding apparatus 602. Therefore, the embodiment of the invention can adjust height of the first protruding portion 608 of the molding apparatus 602 to correspond with the back focal lens of lenses with various specifications.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming an image sensing device, comprising:
    providing a molding apparatus;
    disposing a lens in the molding apparatus;
    injecting an injection material into a chamber of the molding apparatus to form a shell which is connected to the lens; and
    assembling the shell with an image sensing element,
    wherein the lens is formed before injecting the injection material into the chamber; and
    wherein the injection material is doped with a plurality of metal particles.

2. A method for forming an image sensing device, comprising
    providing a molding apparatus;
    disposing a lens in the molding apparatus;
    injecting an injection material into a chamber of the molding apparatus to form a shell which is connected to the lens; and
    assembling the shell with an image sensing element,
    wherein the lens is formed before injecting the injection material into the chamber;
    forming a metal layer on the lens before injecting the injection material into the chamber of the molding apparatus.

3. A method for forming an image sensing device, comprising:
    providing a molding apparatus;
    disposing a lens in the molding apparatus;
    injecting an injection material into a chamber of the molding apparatus to form a shell which is connected to the lens;
    assembling the shell with an image sensing element,
    wherein the lens is formed before injecting the injection material into the chamber; and
    forming a recess in the shell;
    wherein the image sensing element is formed by the steps of:
    providing a substrate;
    forming a photoelectric element array on the substrate;
    forming a micro lens array on the photoelectric element array;
    forming a covering substrate over the substrate and the photoelectric element array;
    forming a spacer for supporting the covering substrate; and
    forming a plurality of solder balls under the substrate.

4. The method for forming an image sensing device as claimed in claim 3, wherein assembling the shell with the image sensing element comprises fitting the covering substrate of the image sensing element into the recess of the shell.

5. A method for forming an image sensing device, comprising:
    providing a molding apparatus;
    disposing a lens in the molding apparatus;
    injecting an injection material into a chamber of the molding apparatus to form a shell which is connected to the lens;
    assembling the shell with an image sensing element,
    wherein the lens is formed before injecting the injection material into the chamber;
    wherein providing the molding apparatus further comprising:
    providing a bottom mold;
    forming a top mold over the bottom mold;
    forming a base between the top mold and the bottom mold, wherein the bottom mold comprises a first protruding portion and a second protruding portion on the first protruding portion.

6. The method for forming an image sensing device as claimed in claim 5, further comprising disposing a height adjusting element on the second protruding portion before injecting the injection material into the chamber of the molding apparatus.

7. The method for forming an image sensing device as claimed in claim 5, further comprising adjusting height of the first protruding portion of the molding apparatus before injecting the injection material into the chamber of the molding apparatus.

* * * * *